(12) United States Patent
Jagasivamani et al.

(10) Patent No.: US 8,064,265 B2
(45) Date of Patent: Nov. 22, 2011

(54) PROGRAMMING BIT ALTERABLE MEMORIES

(75) Inventors: Meenatchi Jagasivamani, Fairfield, CA (US); Richard Fackenthal, Carmichael, CA (US); Ferdinando Bedeschi, Biassono (IT); Enzo Donze, Agrate Brianza (IT)

(73) Assignee: Intel Corporation, Santa Clara, CA (US)

( * ) Notice: Subject to any disclaimer, the term of this patent is extended or adjusted under 35 U.S.C. 154(b) by 780 days.

(21) Appl. No.: 12/012,211

(22) Filed: Jan. 31, 2008

(65) Prior Publication Data

US 2009/0196092 A1 Aug. 6, 2009

(51) Int. Cl.
*G11C 7/00* (2006.01)

(52) U.S. Cl. .............................. 365/185.22; 365/189.15

(58) Field of Classification Search ............. 365/185.22, 365/189.15; 711/103
See application file for complete search history.

(56) References Cited

U.S. PATENT DOCUMENTS

| 6,907,497 B2* | 6/2005 | Hosono et al. ................ 711/103 |
| 2002/0136125 A1* | 9/2002 | Kojima et al. ............. 369/47.54 |
| 2006/0059405 A1* | 3/2006 | Parkinson .................... 714/763 |
| 2007/0047306 A1* | 3/2007 | Roohparvar ............ 365/185.09 |

* cited by examiner

*Primary Examiner* — Son Dinh
(74) *Attorney, Agent, or Firm* — Trop, Pruner & Hu, P.C.

(57) ABSTRACT

Program failures during programming can be corrected during reading using an error correcting code. This allows an array to pass programming more readily, speeding the operation of the memory and avoiding the need to continually reprogram or to issue an error message that the programming was unsuccessful. This makes the memory more user friendly and robust.

23 Claims, 2 Drawing Sheets

PROGRAMMING BIT ALTERABLE MEMORIES

BACKGROUND

This invention relates generally to bit alterable memory devices. These are devices, such as phase change memories, that can be programmed, one bit at a time.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
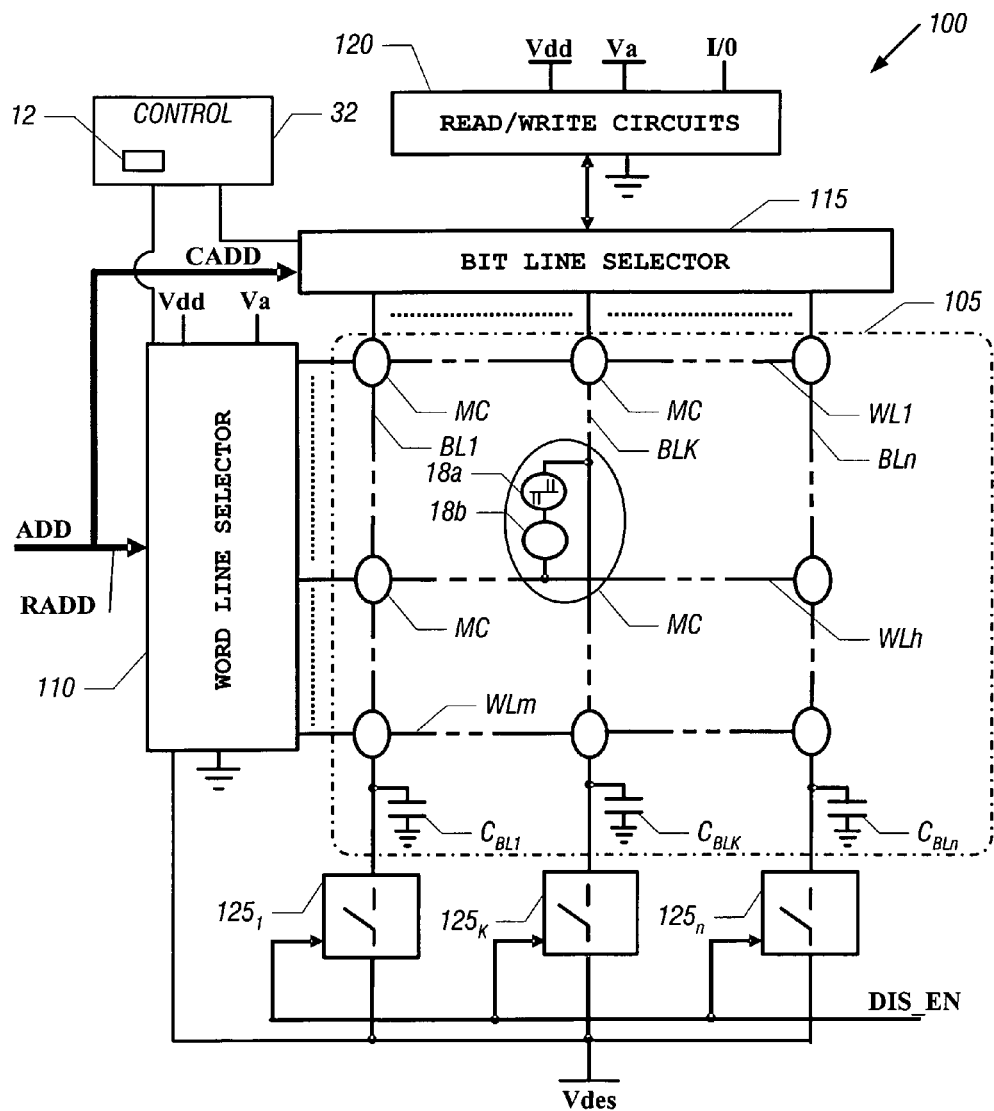
FIG. 1 is a schematic depiction of one embodiment of the present invention.

Referring to FIG. 1, in one embodiment, a bit alterable memory 100 may include an array of memory cells MC arranged in rows WL and columns BL in accordance with one embodiment of the present invention. While a relatively small array is illustrated, the present invention is in no way limited to any particular size of an array. Also, the memory 100 may use single or multi-level memory cells MC. While the terms "rows," "word lines," "bitlines," and "columns" are used herein, they are merely meant to be illustrative and are not limiting with respect to the type and style of the sensed array.

The memory device 100 includes a plurality of memory cells MC typically arranged in a matrix 105. The memory cells MC in the matrix 105 may be arranged in m rows and n columns with a word line WL1-WLm associated with each matrix row, and a bitline BL1-BLn associated with each matrix column.

The memory device 100, in one embodiment, may also include a number of auxiliary lines including a supply voltage line Vdd, distributing a supply voltage Vdd through a chip including the memory device 100, that, depending on the specific memory device embodiment, may be, typically, from 1 to 3 V, for example 1.8 V, and a ground voltage line GND distributing a ground voltage. A high voltage supply line Va may provide a relatively high voltage, generated by devices (e.g. charge-pump voltage boosters not shown in the drawing) integrated on the same chip, or externally supplied to the memory device 100. For example, the high voltage Va may be 4.5-5 V in one embodiment.

The cell MC may be any memory cell including a phase change memory cell. Examples of phase change memory cells include those using chalcogenide memory element 18a and an access, select, or threshold device 18b coupled in series to the device 18a. The threshold device 18b may be an ovonic threshold switch that can be made of a chalcogenide alloy that does not exhibit an amorphous to crystalline phase change and which undergoes a rapid, electric field initiated change in electrical conductivity that persists only so long as a holding voltage is present.

A memory cell MC in the matrix 105 is connected to a respective one of the word lines WL1-WLm and a respective one of the bitlines BL1-BLn. In particular, the storage element 18a may have a first terminal connected to the respective bitline BL1-BLn and a second terminal connected to a first terminal of the associated device 18b. The device 18b may have a second terminal connected to a word line WL1-WLm. Alternatively, the storage element 18a may be connected to the respective word line WL1-WLm and the device 18b, associated with the storage element 18a, may be connected to the respective bitline BL1-BLn.

A memory cell MC within the matrix 105 is accessed by selecting the corresponding row and column pair, i.e. by selecting the corresponding word line and bitline pair. Word line selector circuits 110 and bitline selector circuits 115 may perform the selection of the word lines and of the bitlines on the basis of a row address binary code RADD and a column address binary code CADD, respectively, part of a memory address binary code ADD, for example received by the memory device 100 from a device external to the memory (e.g., a microprocessor). The word line selector circuits 110 may decode the row address code RADD and select a corresponding one of the word lines WL1-WLm, identified by the specific row address code RADD received. The bitline selector circuits 115 may decode the column address code CADD and select a corresponding bitline or, more generally, a corresponding bitline packet of the bitlines BL1-BLn. For example, the number of selected bitlines depending on the number of data words that can be read during a burst reading operation on the memory device 100. A bitline BL1-BLn may be identified by the received specific column address code CADD.

The bitline selector circuits 115 interface with read/write circuits 120. The read/write circuits 120 enable the writing of desired logic values into the selected memory cells MC, and reading of the logic values currently stored therein. For example, the read/write circuits 120 include sense amplifiers together with comparators, reference current/voltage generators, and current pulse generators for writing and reading the logic values stored in the memory cells MC.

In one embodiment, in a stand-by operating condition, as well as before any read or write access to the memory device 100, the word line selection circuits 110 may keep the word lines WL1-WLm at a relatively high de-selection voltage Vdes (e.g., a voltage roughly equal to half the high voltage Va (Va/2)). At the same time, the bitline selection circuits 115 may keep the bitlines BL1-BLn disconnected, and thus isolated, from the read/write circuits 120 or, alternatively, at the relatively low de-selection voltage Vdes. In this way, none of the memory cells MC is accessed, since the bitlines BL1-BLn are floating or a voltage approximately equal to zero is dropped across the access elements 18b, so the deselected row and column lines are at about the same voltage. Spare (redundant) rows and columns may be provided and used with a selection means to replace bad rows, bits, and columns by techniques familiar to those reasonably skilled in the art.

During a reading or a writing operation, the word line selection circuits 110 may lower (or raise if an MOS transistor select device is used) the voltage of a selected one of the word lines WL1-WLm to a word line selection voltage $V_{WL}$ (for example, having a value equal to 0V—the ground potential if a bipolar diode or a chalcogenide select device (such as an ovonic threshold switch) is used), while the remaining word lines may be kept at the word line de-selection voltage Vdes in one embodiment. Similarly, the bitline selection circuits 115 may couple a selected one of the bitlines BL1-BLn (more typically, a selected bitline packet) to the read/write circuits 120, while the remaining, non-selected bitlines may be left floating or held at the de-selection voltage, Vdes. Typically, when the memory device 100 is accessed, the read/write circuits 120 force a suitable current pulse into each selected bitline BL1-BLn. The pulse amplitude depends on the reading or writing operations to be performed.

In particular, during a reading operation a relatively low current pulse (compared to write current pulse magnitude) is applied to each selected bitline in one embodiment. The read current pulse may have a suitable amplitude and a suitable time duration. The read current causes the charging of stray capacitances $C_{BL1}$-$C_{BLn}$ (typically, of about 1 pF), intrinsically associated with the parasitic bitlines BL1-BLn and column drive circuitry, and, accordingly, a corresponding transient of a bitline voltage $V_{BL}$ at each selected bitline BL1-BLn. When the read current is forced into each selected bitline BL1-BLn, the respective bitline voltage raises towards a corresponding steady-state value, depending on the resistance of the storage element 18a, i.e., on the logic value stored in the selected memory cell MC. The duration of the transient depends on the state of the storage element 18a. If the storage element 18a is in the crystalline state and the threshold device 18b is switched on, a cell current flowing through the selected memory cell MC when the column is forced to a voltage has an amplitude lower than the amplitude in the case where the storage element 18a is in the higher resistivity or reset state, and the resulting voltage on the column line when a constant current is forced is lower for a set state relative to reset state.

While a force current, measure voltage embodiment is described, a force voltage, measure current technique can also be used.

The logic value stored in the memory cell MC may, in one embodiment, be evaluated by means of a comparison of the bitline voltage (or another voltage related to the bitline voltage) at, or close to, the steady state thereof with a suitable reference voltage, for example, obtained exploiting a service reference memory cell in an intermediate state or its equivalent. As another example, a reference current generator can be used in place of a reference memory cell to generate a reference current. The reference voltage can, for example, be chosen to be an intermediate value between the bitline voltage when a logic value "0" is stored and the bitline voltage when a logic value "1" is stored.

In order to avoid spurious reading of the memory cells MC or to properly terminate the write cycle, the bitline stray capacitances $C_{BL1}$-$C_{BLn}$ may be discharged before performing a read operation. To this purpose, bitline discharge circuits $125_1$-$125_n$ are provided, associated with the bitlines BL1-BLn. The bitline discharge circuits $125_1$-$125_n$ may be enabled in a bitline discharge phase of the memory device operation, preceding and after any operation, for discharging the bitline stray capacitances $C_{BL1}$-$C_{BLn}$, in one embodiment.

The bitline discharge circuits $125_1$-$125_n$ may be implemented by means of transistors, particularly N-channel MOSFETs having a drain terminal connected to the corresponding bitline BL1-BLn, a source terminal connected to a de-selection voltage supply line Vdes providing the de-selection voltage Vdes and a gate terminal controlled by a discharge enable signal DIS_EN in one embodiment. Before starting a writing or a reading operation, the discharge enable signal DIS_EN may be temporarily asserted to a sufficiently high positive voltage, so that all the discharge MOSFETs turn on and connect the bitlines BL1-BLn to the de-selection voltage supply line Vdes. The discharge currents that flow through the discharge transistors cause the discharge of the bitline stray capacitances $C_{BL1}$-$C_{BLn}$ for reaching the de-selection voltage Vdes. Then, before selecting the desired word line WL1-WLm, the discharge enable signal DIS_EN is de-asserted and the discharge MOSFETs turned off. Similarly, to minimize access delay, the selected row and column lines may be respectively pre-charged to an appropriate safe starting voltage for selection and read or write operation. For example, the row line may be precharged to zero volts while the column if forced to a voltage slightly less than minimum threshold voltage of the OTS.

The selection device 18b may be formed of a non-programmable chalcogenide material. While an embodiment is illustrated in which the selection device 18b is positioned over the phase change memory element 18a, the opposite orientation may be used as well.

Conversely, the phase change memory element 18a may be capable of assuming either a set or reset state, explained in more detail hereinafter. The phase change memory element 18a may include an insulator, a phase change memory material, a top electrode, and a barrier film, in one embodiment of the present invention. A lower electrode may be defined within the insulator in one embodiment of the present invention.

In one embodiment, the phase change material may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material for the selection device 18b may be chalcogenide element composition from the class of tellurium-germanium-antimony ($Te_xGe_ySb_z$) material or a GeSbTe alloy (such as x=2, y=2, z=5), although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials to the word lines and bitlines or forcing a current of adequate amplitude to melt the material, thereby generating a voltage potential across the memory material. An electrical current may flow through a portion of the memory material in response to the applied voltage potentials or current forced, and may result in heating of the memory material.

This heating and subsequent cooling may alter the memory state or phase of the memory material. Altering the phase or state of the memory material may alter an electrical characteristic of the memory material. For example, resistance of the material may be altered by altering the phase of the memory material. The memory material may also be referred to as a programmable resistive material or simply a programmable resistance material.

In one embodiment, a voltage potential difference of about 0.5 to 1.5 volts may be applied across a portion of the memory material by applying about 0 volts to a word line WL and about 0.5 to 1.5 volts to a bitline. A current flowing through the memory material in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material 64 may be heated to a relatively higher temperature to amorphisize memory material and "reset" memory material. Heating the volume or memory material to a relatively lower crystallization temperature may crystallize memory material and "set" memory material. Various resistances of memory material may be achieved to store more than one logical bit in one physical bit by varying the amount of current flow and duration through the volume of memory material. Alternatively, the bit may be written by tailoring the edge rate of the trailing edge of the programming current or voltage pulse, such as by using a trailing edge rate of less than 100 nsec to reset the bit or a trailing edge greater than 500 nsec to set the bit.

The information stored in memory material may be read by measuring the resistance of the memory material. As an example, a read current may be provided to the memory material using opposed lines and a resulting read voltage across the memory material may be compared against a reference voltage using, for example, a sense amplifier. The read voltage above the selection device (such as an ovonic threshold switch, diode, or MOS transistor) may be proportional to the resistance exhibited by the memory storage element.

In order to select a cell MC on a column and row, the selection device 18b for the selected cell MC at that location may be operated. The selection device 18b activation allows current to flow through the memory element 18a in one embodiment of the present invention.

In a low voltage or low field regime, the device 18b is off and may exhibit very high resistance in some embodiments. The off resistance can, for example, range from 100,000 ohms to greater than 10 gigaohms at a bias of half the threshold voltage, such as about 0.4V. The device 18b may remain in its off state until a threshold voltage $V_T$ or threshold current $I_T$ switches the device 18b to a highly conductive, low resistance selected on state. The voltage across the device 18b after turn on drops to a slightly lower voltage relative to V threshold, called the holding voltage $V_H$ plus the current forced times the dynamic resistance of the "on" selection device. In one embodiment of the present invention, as an example, the threshold voltage may be on the order of 1.1 volts and the holding voltage may be on the order of 0.9 volts, and the dynamic resistance may be 500 ohms.

After passing through the snapback region, in the on state, the device 18b voltage drop remains close to the holding voltage as the current passing through the device is increased up to a certain, relatively high, current level for writing or relatively low current for reading. Above that current level the device remains on but displays a finite differential resistance with the voltage drop increasing with increasing current. The device 18b may remain on until the current through the device 18b is dropped below a characteristic holding current value that is dependent on the size and the material utilized to form the device 18b.

In some embodiments of the present invention, the selection device 18b does not change phase. It remains permanently amorphous and its current-voltage characteristics may remain the same throughout its operating life.

As an example, for a 0.5 micrometer diameter device 18b formed of TeAsGeSSe having respective atomic percents of 16/13/15/1/55, the holding current may be on the order of 0.1 to 100 micro-amps in one embodiment. Below this holding current, the device 18b turns off and returns to the high resistance regime at low voltage, low field. The threshold current for the device 18b may generally be of the same order as the holding current and preferably greater than the holding current to avoid oscillations depending on read bias point. The holding current may be altered by changing process variables, such as the top and bottom electrode material and the chalcogenide material. The device 18b may allow a relatively high "on current" for a given area of device and voltage across it compared to conventional access devices such as metal oxide semiconductor field effect transistors or bipolar junction transistors or diodes.

In some embodiments, the higher current density of the device 18b in the on state allows for higher programming current available to the memory element 18a at reduced array voltages. Where the memory element 18a is a phase change memory, this enables the use of larger programming current phase change memory devices, reducing the need for sub-lithographic feature structures and the commensurate process complexity, cost, process variation, and device parameter variation.

One technique for addressing the array 105 uses a voltage V applied to the unselected column and rows, with zero voltage applied to the selected row. For the case where the device 100 is a phase change memory, the voltage V is chosen to be greater than or equal to the device 18b minimum threshold voltage, but less than two times the device 18b minimum threshold voltage. In other words, the maximum threshold voltage of the device 18b, and the maximum holding voltage of device 18b plus the maximum reset threshold voltage of the device 18a may be less than 2V. All of the unselected rows and columns may be biased at V/2.

With this approach, there is no bias voltage between the unselected rows and unselected columns. This reduces and minimizes background and standby leakage current.

After biasing the array in this manner, the memory elements 18a may be programmed and read by whatever means is needed for the particular memory technology involved, the dynamic resistances of the select device 18b and memory 18a are low enough so that the memory is above to be written in less than 2V volts. A memory element 18a that uses a phase change material may be programmed by forcing the current needed for memory element phase change or the memory array can be read by forcing a lower current to determine the device 18a resistance.

For the case of a phase change memory element 18a, programming a given selected bit in the array 105 can be as follows. Unselected rows and columns may be biased as described for addressing, such as at V. Zero volts is applied to the selected row. A current is forced on the selected column with a voltage compliance that is greater than the maximum threshold voltage of the device 18b, and equal to the maximum holding voltage plus the maximum threshold voltage of the device 18a plus margin to allow write. The current amplitude, duration, and pulse shape may be selected to place the memory element 18a in the desired phase and thus, the desired memory state. Preferably, the write pulse is terminated with a fast edge rate less than 10 nsec to write a reset bit and a slow edge rate greater than 200 nsec to write a set bit.

Reading a phase change memory element 18a can be performed as follows. Unselected rows and columns may be biased as described previously at V. Zero volts is applied to the selected row. A voltage is forced at a value greater than the maximum threshold voltage of the device 18b, but less than the minimum holding voltage of the device 18b plus the minimum threshold voltage of the element 18a on the selected column. The current compliance of this forced voltage is less than the current that could program or disturb the set phase of the memory element 18a. If the phase change memory element 18a is set, the access device 18b switches on and presents a low voltage, high current condition to a sense amplifier. If the device 18a is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

Figure 2:
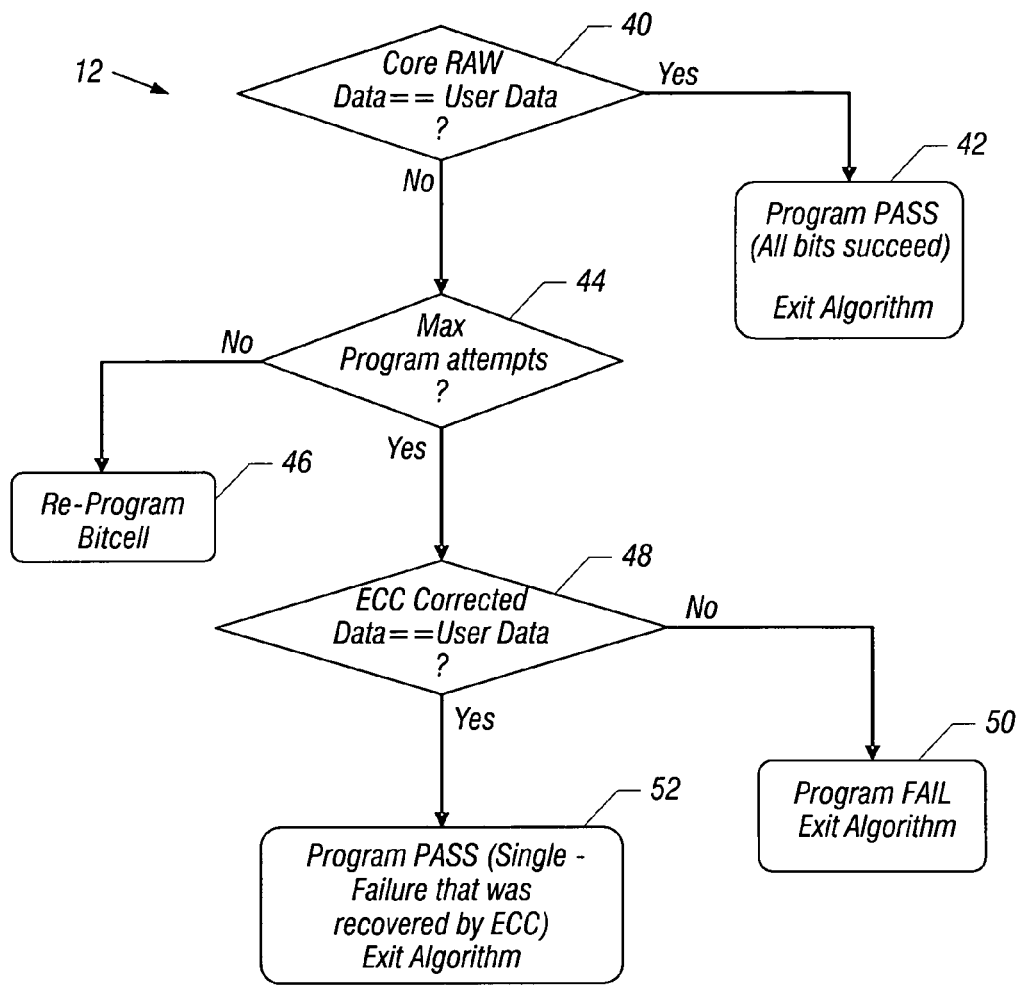
FIG. 2 is a flow chart for one embodiment of the present invention.

Referring to FIG. 2, the algorithm 12 is part of the control 32. The algorithm 12 may be implemented in hardware, software, or firmware and, in one embodiment, may be implemented by code stored in a semiconductor memory. The algorithm 12 begins by determining whether the core raw data that is stored in the array 105 is the same as the user data to be programmed. In other words, the core raw data is the data that has been programmed and it is checked against the actual user data to be programmed. This can be done by a read verify operation, for example. If, at diamond 40, the core raw data is the same as the user data, then a program pass is issued since all bits have been programmed correctly and the algorithm is exited as indicated at 42.

If there are some differences, as determined at diamond 40, then a check at diamond 44 determines whether the maximum number of programming attempts has been reached. The maximum number of programming steps may be set within the algorithm 12 at a default value. If not, as determined at diamond 44, the cells are reprogrammed as indicated in block 46.

If the maximum number of programming attempts has been reached, then a check at diamond 48 determines whether the corrected data from the error correction code (ECC) equals the user data. In other words, if there is a given read bandwidth and a given number of bits of code correctable by error correcting code, the check at diamond 48 determines whether the number of errors is within the number of correctable bits. This indicates that the error correcting code is able to correct the single failures from the programming operation during a read operation. The programming errors could be corrected during the read operation in order to save time in programming.

If not, a program fail is issued, as indicated in block 50. If so, a program pass is issued, as indicated in block 52. The program pass indicates that the number of program failures is low enough to be recovered by an error correcting code during reading. In other words, the number of programming errors is still sufficiently low to enable them to be corrected by error correcting codes during the read operation.

Thus, even though there is a program failure, a pass is issued allowing the product to be used because it is known that the number of programming defects is sufficiently low as to fall within the window correctable by error correcting codes during reading.

Figure 3:
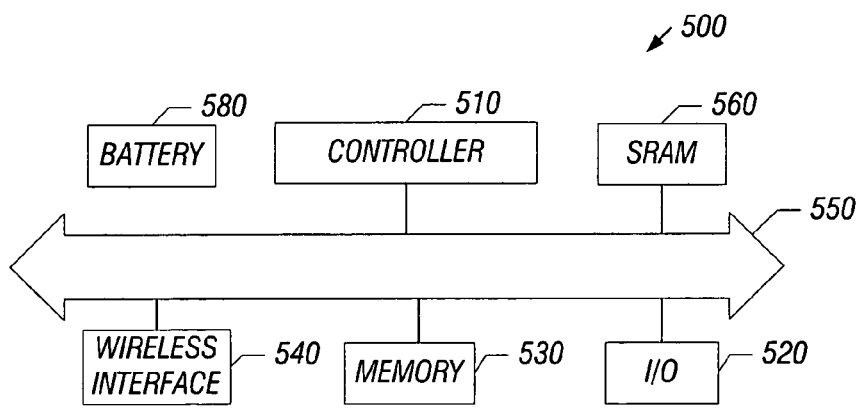
FIG. 3 is a system diagram for one embodiment of the present invention.

Turning to FIG. 3, a portion of a system 500 in accordance with an embodiment of the present invention is described. System 500 may be used in wireless devices such as, for example, a cellular telephone, personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540, coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory that includes a memory element 18a such as, for example, memory 100 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   determining whether one or more bits of a bit alterable memory were not correctly programmed;
   determining whether the number of program errors is less than the number of bits correctable by an error correcting code; and
   if so, passing the memory and allowing a program error to be corrected during a read operation using error correcting code.

2. The method of claim 1 including comparing the programmed data to data received from a user to be programmed.

3. The method of claim 2 including determining that the programmed data does not correspond to the user data to be programmed and, in response thereto, determining whether a maximum number of programming attempts have been undertaken.

4. The method of claim 3 including, if the number of programming attempts has reached the maximum, determining whether the number of program failures is within the number of errors correctable by error correcting code.

5. The method of claim 1 including programming a phase change memory.

6. A bit alterable memory comprising:
   an array of hit alterable memory cells; and
   a control to determine whether one or more bits of said array were not correctly programmed, determine whether the number of program errors is less than the number of bits correctable by an error correcting code and, if so, pass the memory and allow a program error to be corrected during a read operation using error correcting code.

7. The memory of claim 6 wherein said array of bit alterable memory cells is an array of phase change memory cells.

8. The memory of claim 7, said control to compare programmed data to data received from the user to be programmed.

9. The memory of claim 8, said control to determine if the programmed data does not correspond to the user data to the programmed and, in response thereto, determine whether a maximum number of programming attempts have been undertaken.

10. The memory of claim 9, said control to determine whether the number of program failures is within the number of errors correctable by error correcting code if the number of programming attempts has reached the maximum.

11. A computer readable medium storing instructions that, if executed, enable a computer to:
    determine whether one or more bits of the bit alterable memory were not correctly programmed;
    determine whether the number of program errors is less than the number of bits correctable by an error correcting code; and
    if so, pass the memory to allow a program error to be corrected during a read operation using error correcting code.

12. The medium of claim 11 further storing instructions to enable the computer to compare the programmed data to data received from a user to be programmed.

13. The medium of claim 12 further storing instructions to enable the computer to determine that the programmed data does not correspond to the user data to the programmed and, in response thereto, determine whether a maximum number of programming attempts have been undertaken.

14. The medium of claim 13 further storing instructions that enable the computer to determine whether the number of program failures is within the number of errors correctable by error correcting code if the number of programming attempts has reached a maximum.

15. A system comprising:
    a processor; and
    a bit alterable memory including an array of bit alterable memory cells, and a control to determine whether one or more bits of said array were not correctly programmed, determine whether the number of program errors is less than the number of bits correctable by an error correcting code and, if so, pass the memory and allow a program error to be corrected during a read operation using error correcting code.

16. The system of claim 15 wherein said array of bit alterable memory cells is an array of phase change memory cells.

17. The system of claim 16, said control to compare the programmed data to data received from the user to be programmed.

18. The system of claim 17, said control to determine if the programmed data does not correspond to the user data to be programmed and, in response thereto, determine whether a maximum number of programming attempts have been undertaken.

19. The system of claim 18, said control to determine whether the number of program failures is within the number of errors correctable by error correcting code if the number of programming attempts has reached the maximum.

20. A method comprising:
    correcting program errors using error correcting code when reading bit alterable memory cells; and
    determining whether a number of program failures exceeds the number of bits correctable by error correcting code.

21. The method of claim 20 including determining that a program failure can be corrected during reading using error correcting code.

22. A bit alterable memory comprising:
    an array of bit alterable memory cells; and
    a control to read bits in said array, said control to correct program failures using error correcting code during reading, said control to compare programmed data to data received from the user to be programmed, said control to determine if the programmed data does not correspond to the user data to be programmed and, in response thereto, determine whether a maximum number of programming attempts have been undertaken.

23. The memory of claim 22 wherein said cells are phase change memory cells.

* * * * *